United States Patent
Hurwitt et al.

(10) Patent No.: US 6,416,635 B1
(45) Date of Patent: Jul. 9, 2002

(54) METHOD AND APPARATUS FOR SPUTTER COATING WITH VARIABLE TARGET TO SUBSTRATE SPACING

(75) Inventors: Steven Hurwitt, Park Ridge, NJ (US); Israel Wagner, Monsey, NY (US)

(73) Assignee: Tokyo Electron Limited, Tokyo (JP)

( * ) Notice: Subject to any disclaimer, the term of this patent is extended or adjusted under 35 U.S.C. 154(b) by 1160 days.

(21) Appl. No.: 08/505,739

(22) Filed: Jul. 24, 1995

(51) Int. Cl.$^7$ .............................................. C23C 14/34
(52) U.S. Cl. ......................... 204/192.13; 204/192.12; 204/298.03; 204/298.23; 204/298.29
(58) Field of Search ..................... 204/192.12, 192.13, 204/298.03, 298.12, 298.15, 298.2, 298.23, 298.29

(56) References Cited

U.S. PATENT DOCUMENTS

| 4,166,783 A | | 9/1979 | Turner .................... 204/192.13 |
| 4,500,408 A | | 2/1985 | Boys et al. ............ 204/298.13 |
| 4,595,482 A | | 6/1986 | Mintz .................... 204/298.13 |
| 4,894,132 A | * | 1/1990 | Tanaka .................. 204/298.03 |
| 4,957,605 A | * | 9/1990 | Hurwitt et al. ......... 204/192.12 |
| 5,174,875 A | | 12/1992 | Hurwitt et al. ........ 204/192.12 |
| 5,284,561 A | | 2/1994 | Shinneman et al. ... 204/192.13 |
| 5,540,821 A | * | 7/1996 | Tepman ................. 204/298.23 |

FOREIGN PATENT DOCUMENTS

| EP | 0 634 782 | * | 1/1995 | |
| JP | 4-329876 | * | 11/1992 | |
| JP | 5-78832 | * | 3/1993 | ............ 204/298.12 |

* cited by examiner

*Primary Examiner*—Rodney G. McDonald
(74) *Attorney, Agent, or Firm*—Wood, Herron & Evans, L.L.P.

(57) ABSTRACT

Thickness uniformity of films sputtered from a target onto a series of substrates is maintained as the target surface shape changes due to the consumption of the target. The eroded condition of the target is sensed by directly measuring the position of a point on the target surface, by measuring power consumption of the target, by measuring deposition from the surface of the target or by some other means. A controller responds to the measurement by moving a substrate holder to determine an amount to change the distance between the substrate and the target, usually by moving the substrate closer to the target, by an amount necessary to maintain uniformity of the coatings on the wafers being processed. A servo or stepper motor responds to a signal from the controller to move the substrate holder in accordance with the determined amount of distance change required. The adjustment is made following the coating of wafers at various times over the life of the target.

6 Claims, 3 Drawing Sheets

METHOD AND APPARATUS FOR SPUTTER COATING WITH VARIABLE TARGET TO SUBSTRATE SPACING

FIELD OF INVENTION

This invention relates to cathode sputter deposition and more particularly to a method and apparatus for overcoming the adverse effects on deposited thin film uniformity from wafer to wafer due to changes in sputtering target geometry as a result of the utilization of target material.

BACKGROUND OF THE INVENTION

In sputter deposition processes, substrates are placed in a processing chamber adjacent to a sputtering cathode target, which serves as a source of coating material. The pressure in the processing chamber, which is usually filled with an inert gas such as argon, is then reduced to a near vacuum, and a negative voltage is applied to the target. The negatively charged target emits electrons, which strike and ionize atoms of the gas to produce a plasma discharge. Often the plasma is intensified and confined over the target surface by the application of a magnetic field generated by magnets, which are usually placed behind or around the periphery of the target. The large quantities of positive ions from the plasma that are produced in the sparse gas within the chamber are attracted to the negatively charged target, bombarding its surface and thereby dislodging atoms or small particles of the material of which the target is made from the surface of the target. The atoms or particles move across the space in front of the target until they strike the surface such as the surface of a semiconductor wafer or other substrate disposed, for example, in a plane parallel to the surface of the target, where they adhere to the substrate surface and form a thin film or coating layer thereon.

A primary consideration in designing a sputter deposition process has long been to achieve a specified degree of uniformity in the thickness of the resultant film being deposited on the substrate. In semiconductor wafer manufacturing processes, for example, such uniformities in the area of +/−2 to 5 percent or better are currently being demanded. Factors that influence the degree of uniformity achieved in sputter deposition include the relative sizes of the target and substrates, the configurations of field producing magnets and other factors controlling the utilization or erosion profile of the target and the sputtering target to substrate spacing.

In the prior art, the factors of target to substrate size ratio, magnet design to control target erosion profile and target to substrate spacing are designed into the sputtering target and cathode assembly of the sputtering apparatus in an effort to produce the required film thickness uniformity. For a given target material, and with other process conditions being held constant, cathode assembly design has provided an ability to deposit films to some degree of the desired uniformities with targets of limited thickness, where the erosion of the target surface over the life of the target cannot materially alter the target to substrate spacing that was the basis for the system design. With such constant geometries, those skilled in the art of sputtering system design have concentrated on the control of erosion profiles, for example by altering magnet configuration, to fine tune the cathode design to achieve the desired film uniformity.

Typical prior art semiconductor wafer sputter deposition systems have employed targets of, for example ten inches (250 mm) in diameter to apply coatings to six inch (150 mm) diameter wafers. With such applications, uniformity in film thickness was approached by configuring sputtering cathode magnets to produce a greater sputtering rate around the periphery of the target, usually outside of the six inch diameter of the wafer, to simulate the incidence of sputtered material onto the substrate from the remote regions of a sputtering target of infinite diameter, which in theory would produce a equal incidence of sputtered material on every increment of the surface of the substrate. The increased sputtering rate around the periphery of the target compensates for target size limitations and increases the uniformity of the deposited film.

Theoretically also, with the target of infinite diameter, uniformity of the deposited coating is not generally affected by target to substrate spacing, at least not by spacing variations of thirty to fifty percent where other effects, not necessary to consider here, would not be factors. However, with finite targets, increased sputtering around a peripheral area of the target causes a more deeply eroded peripheral area or annular groove to form around the rim of the target. As the target erodes, the target surface recedes from the substrate, and does so faster at the target rim than at the center of the target. The target to substrate spacing change produces substantial changes in the rate at which material is deposited in the vicinity of the rim of the substrate. However, at the center of the substrate, the deposition rate is much less affected by such changes.

With a ten inch target used for coating six inch wafers, targets having thicknesses of from one-sixteenth inch to one and one-half inches are commonly found. Typically, target-to-substrate spacing with such targets may be approximately two inches. With the thin target, the target-to-substrate spacing change experienced over the life of the target will be at most about three percent, which should have a negligible effect on the deposition uniformity on the substrate. With the thicker targets, however, the erosion of a peripheral groove can result in an increase in target-to-substrate spacing, at certain points on the target, by more than seventy percent. Such changes can result in substantial decreases in the deposition rates on the substrate, particularly in the vicinity of the substrate rim. Thus, cathodes designed to produce a desired coating uniformity on wafers early in the life of the target do not coat wafers with sufficiently uniform films late in the life of the target.

Some prior art systems have been proposed in which the deposition rate "roll-off" or decrease over the life of the sputtering target due to the progressive erosion of the target is offset by an increase in sputtering power. Such increases in many such systems have a uniform compensating effect across the surface of the target. Thus, where the erosion rate roll-off is usually greater at the peripheral groove on the target than at the target center, the uniformity of the coating changes along with the reduction in deposition rate as the target erodes, while the loss of uniformity is retained as the sputtering power is increased. Some systems have disproportionately increased sputtering power around the peripheral groove. While such adjustment is possible where stationary electromagnets are used, in those sputtering systems where rotating permanent magnets are desired, magnet field compensation for non-uniform deposition rate roll-off is less practical and less effective. This increases cathode assembly complexity, and is difficult with one piece sputtering targets, and tends to even more greatly increase the erosion rate around the rim of the target in proportion to the area in the target center. Such schemes of compensating for erosion, however, also have effects on voltage levels, component heating and plasma shaping that have other often adverse, undesirable or troublesome effects.

Accordingly, there is a need for an effective and efficient method and apparatus for maintaining high degrees of deposited film uniformity in a sputter coating process, particularly where thick targets are employed which substantially are substantially eroded over their useful lives.

SUMMARY OF THE INVENTION

It is a primary objective of the present invention to maintain a desired sputtered film thickness distribution throughout the life of a sputtering target. A more particular objective of the present invention is to overcome changes in deposited film uniformity caused by changes in the geometry of the surface of a sputtering target as the target erodes. A specific objective of the present invention is to provide a method and apparatus for maintaining the uniformity of films deposited by a thick sputtering target, from substrate to substrate, over the lifetime of the target. It is a further objective of the present invention to provide for the automatic adjustment of conditions or parameters of sputter deposition to consistently produce uniform film thickness on substrates being coated, over the useful life of the sputtering target, without the need for manual adjustment by an operator or other operator intervention.

In accordance with the principles of the present invention, there are provided a method and an apparatus in which the relative position of the substrate in relation to the position of the sputtering target is changed to compensate for changes in target geometry, due to the consumption or erosion of the surface of the sputtering target during use, and to thereby maintain the deposition uniformity. The change in target-to-substrate spacing is preferably made automatically in response to a measurement of some parameter related the target erosion, and is made to achieve a distance that varies in a predetermined relationship or as a predetermined function of the state of erosion of the target.

According to the preferred embodiment of the present invention, the relative positions of a substrate holder and a target support on a cathode assembly are changed during the life of the target. The position changes are made to maintain a predetermined distance between the surfaces of substrates that are to be coated, when mounted on the substrate holder, and the surface of a sputtering target, supported on the cathode holder in the cathode assembly, as the target is consumed during the processing of a sequence of wafers. As a first order of approximation, the predetermined distance, as a function of target erosion, may be considered a linear function that maintains the substrate at a constant distance from the average depth of the erosion groove. However, due to effects such as self-shadowing, redeposition, and other effects, it is generally found that the function is an increasing function requiring a greater decrease in target-to-substrate spacing for each unit of erosion of the peripheral groove. Furthermore, the relationship between the relative positioning of the substrate and target and target erosion is dependent on target material, magnetron design, the absolute distance from target to substrate and other factors. Thus, either a correction table, a list of coefficients or a specific function is preferably provided, most conveniently in software or in the form of data to be input to a controller of the machine. Such data or function may be generated, for example by a sputtering apparatus and target manufacturer, by coating test wafers, one at each of a plurality of spacings at, for example, 0.05 inch increments over a range, at various times, for example 10 or more, over the life of a test target. In this way, a table or equation may be generated describing the relationship between target-to-substrate spacing and coating uniformity.

The spacing of substrates supported on a holder in a sputter coating chamber and a target of a sputtering cathode assembly in such chamber is so maintained throughout the sputtering life of the target, by continuous or periodic adjustments of the target to substrate spacing. Normally this requires reducing the distance between the target and substrate holders, but in some cases an increase in the distance may be required to maintain uniformity. The adjustments may be made during the processing of individual substrates but are preferably performed between coating operations, when changes of the wafers or substrates are being made. Such distance changes are made progressively at various intervals throughout the life of the target, whenever enough of a change in the profile of the target is anticipated to affect coating uniformity. Such changes might be made after every fifty wafers are processed, or at one hundred or more times over the life of a target. With thicker targets such as aluminum which deposit thicker films onto the substrates and accordingly erode to depths of more than an inch over their lifetimes, more adjustments are required than with less thick targets.

In the preferred embodiment of the invention, a substrate holder is positioned in a sputtering chamber at an initial distance form a sputtering cathode assembly when a target is new and uneroded so as to achieve a designed target-to-substrate spacing. As the target erodes and its surface recedes from its initial position, the substrate holder is caused to move toward the target to maintain a predetermined target-to-substrate relationship. As the target erodes more deeply, the predetermined relationship changes in accordance with the collected data to maintain coating uniformity.

In the preferred embodiment of the invention, a thick target is employed which, during its lifetime, substantially changes in shape as material from its sputtering surface is depleted. Such targets are, for the coating of semiconductor wafers, for example, frequently circular in shape and somewhat larger in diameter than the diameters of circular substrate wafers being coated. Further, such targets frequently are provided with plasma shaping and enhancing magnetron structures that cause the sputtering to occur at a greater rate from a peripheral ring or annular erosion groove, usually lying outside of the diameter of the wafers being coated, than from the circular central region of the target lying within the annular groove. This use of a peripheral erosion groove causes the surface of the target to recede from its initial position faster at the area near the target rim than at the central area. In the preferred embodiment of the invention, the target-to-substrate spacing is readjusted, as wafers are processed over the life of the target, to maintain a target-to-substrate distance between the surface of the substrate and the average sputtering surface of the target to achieve desired coating uniformity.

Further in accordance with certain preferred embodiments of the invention, there is provided a sputtering apparatus having the capability of determining the state of erosion of the target and particularly the depth of the average of the erosion groove on the target surface. Such determination may be made by direct surface position measurements, for example with one or more sensors provided in the chamber. Such sensors could include, for example, laser optical devices that use light reflected from points on the target surface and produce signals related to the position or distance of the point on the target surface to the sensor. Due to target surface irregularities that develop as a target is eroded, a scanning type laser that takes several measurements and/or logic in a computer or controller to interpret the measurements would be required.

Preferably, however, erosion measurement is made by an alternative method of measuring the power consumed by the target over each increment of time from the beginning of the life of the target and the measurements summed so as to integrate the power measurement up to the present. This produces a value representative of the total energy consumed by the target from the beginning of its life to the present. This energy data is stored and continually updated. Such total energy consumption is correlated with stored data to determine the specific erosion state of the target. This is further correlated with stored data to produce a calculated representation of the erosion profile as a function of the age of the target measured in units of consumed total energy. The measurement of energy need not be from the absolute beginning of the life of the target but may be from any beginning point over the life of the target, with data being stored relating to the use of the target or its surface condition up to the beginning point of the energy measurements.

Further in the alternative, other forms of target erosion measurement may be used, such as by counting the number of wafers coated and correlating the count with data relating the count to target usage, in a manner similar to that for the measurement of energy discussed above.

In response to such measurements of target erosion, the spacing between the target holder and substrate support is adjusted, usually by reducing such spacing to achieve or maintain a desired distance between the target surface and substrate surface, preferably by moving the substrate toward the target. The amount of adjustment is preferably based on a determination from the measurements of the change in the depth of the most deeply eroded portion of the target, particularly where that portion is a peripheral groove. Alternatively, the amount of adjustment can be keyed primarily to the amount of erosion of the peripheral region of the target, or to some other function of erosion that has been empirically or by computer modeling determined to have a known relation to film uniformity, so that the amount of adjustment can be calculated based on the determination. In the embodiment of the invention in which a target is eroded to form a peripheral erosion groove, the adjustment is made by moving the substrate somewhat less than would be required to maintain a constant distance between the substrate surface and the bottom of the peripheral groove. Preferably, the sputtering apparatus is provided with a microprocessor in its control that calculates such adjustment based on a stored table or function in memory.

In response to the calculations based on the target surface position measurements, either the target or substrate, but preferably the substrate, is moved to adjust the target-to-substrate spacing, keeping the target and substrate parallel. The movement may be achieved by providing a servo or stepper motor linked to the substrate holder, for example, by a gear or ball screw drive or other suitable drive mechanism. Preferably, a feedback sensor of some sort is employed to verify the operation of the motor. Such, sensor may be a position indicator built into the servo or stepper motor or motor driver, or such as a position decoder or resolver linked to the motor output or otherwise between the substrate and substrate support.

In an alternative embodiment, a deposition rate sensor may be employed to measure the incidence of sputtering material across the wafer surface. Such a sensor may be set up to take deposition readings between the processing of wafers so that the sensors can more easily occupy the position of the wafer. The controller of the apparatus may then be programmed to adjust the position of the substrate holder or target until uniform incidence of material is realized. In the alternative, servo or stepper motor with feedback control from such a sensor may be used.

With the method and apparatus of the present invention, the sputtered film uniformity that existed across the surfaces of wafers sputtered from the target at the beginning of the target's life is closely maintained across wafers coated sputtered throughout and toward the end of the life of the target.

These and other objectives of the present invention will be more readily apparent from the following detailed description of the preferred embodiment of the invention in which:

DETAILED DESCRIPTION OF THE PREFERRED EMBODIMENT

Figure 1:
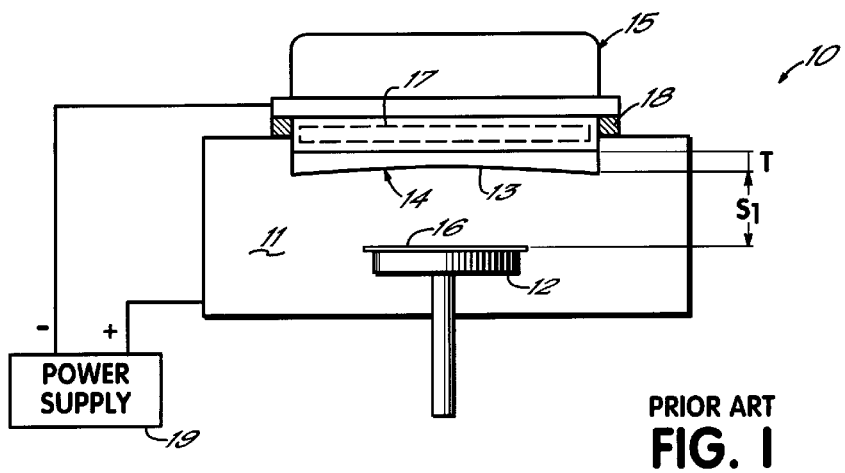
FIG. 1 is diagrammatic representation of a sputter coating apparatus according to the prior art.

A typical sputtering apparatus 10 of the prior art is diagrammatically illustrated in FIG. 1. The apparatus 10 includes a vacuum processing chamber 11 in which is mounted a wafer or other substrate holder or platform 12. The platform 12 is typically situated and oriented parallel to the surface 13 of a sputtering target 14 held in a sputtering cathode assembly 15. The platform 12 may be moveable into and out of the chamber 11 but is usually maintained in a fixed position, at least relative to the cathode assembly 15, during the sputter deposition of films onto wafers, such as wafer 16, held by clamping structure (not shown) on the surface of the platform 12. A common configuration of such prior art sputtering apparatus 10 provides the cathode assembly 15 with a magnet assembly 17, which produces a magnetic field (not shown) over the surface of the target 14 that confines and enhances a plasma adjacent the surface 13 of the target 14. Such magnet assembly 17 is frequently positioned behind the target 14, as illustrated, or may be positioned at least in part around the periphery of the target 14. Such magnet assembly 17 may be stationery or moveable, and may be formed of permanent magnets or electromagnets.

The cathode assembly 15 of such an apparatus 10 is usually electrically insulated from the wall of the chamber 11, for example by mounting the cathode assembly 15 to the wall of the chamber 11 through an insulator ring 18. The cathode assembly 15 is energized to a negative potential relative to the wall of the chamber 11 by a power supply 19.

Sputtering systems of the prior art, such as the apparatus 10, are designed to provide a desired coating film distribution across the surface of the substrate 16. Such design will include the provision of an optimal target-to-substrate spacing and a specifically designed magnet configuration. The drawings illustrate a typical configuration in which the target 14 has a diameter greater than that of the substrate 16 to be coated. For example, for substrates in the form of circular wafers having a diameter of about six inches, a target 14 typically is circular and has a diameter of about ten inches. With such targets 14, the cathode assembly 15 typically includes a circular magnet array behind the target 14, often in the form of a rotating magnet having an axis at the center of the target, which produces a increased magnetic field dwell around the rim of the target, causing enhanced emission of sputtered material around the rim of the target 14 and outside of the rim of the wafer or substrate 16, thereby causing the formation of a peripheral erosion groove as the target 14 is used. The erosion profile is achieved by the design of the magnet assembly 17, which, once a profile is determined, is within the skill of those engaged in the design of such magnet assemblies in the sputtering art.

Figure 2:
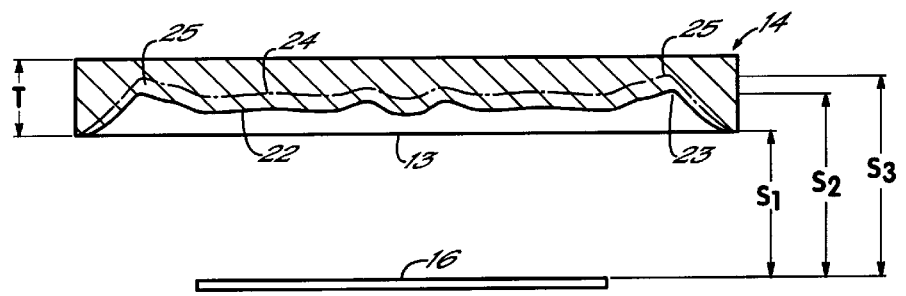
FIG. 2 is a cross-sectional diagram of the sputtering target of the prior art FIG. 1 showing the initial position and shape of its sputtering surface and two erosion profiles that are typical at points in the life of the target, and associated target-to-substrate distances.

A typical erosion profile is illustrated in FIG. 2, in which the target 14 is shown with its initial surface 13 spaced a distance $S_1$ from the substrate 16. The surface 13 represents the location of the target surface within, for example, the first 50 kilowatt hours (kWH) of usage of the target 14. At this stage in the life of the target, the profile conforms closely to the original surface of the target. While a peripheral groove tends to form at this stage, its depth is not so significant as to have caused a change in the uniformity of deposited films from wafer to wafer. For thin targets, this remains the case throughout the life of the target.

In FIG. 2 is also illustrated an erosion profile 22, which is typical of an eroded shape of the surface of the target 14 after, for example, 750 kWH of usage where the target 14 is relatively thick. Such a profile develops an erosion groove 23 adjacent the periphery of the target 14 that significantly changes the distance between some parts of the target surface and the substrate. The bottom of the groove 23 is located a distance $S_2$ from the substrate 16. Similarly, also illustrated in phantom lines is an erosion profile 24, which represents the eroded shape of the surface of the target 14 after, for example, 1500 kWH of usage. Such a profile has its erosion groove 25 adjacent the periphery of the target 14 a distance $S_3$ from the substrate 16. Targets that take on this form are relatively thick targets, such as those of aluminum, that are used to sputter blanket base conductor layers of, for example, one micron in thickness on a wafer. Over the life of such a target, where several thousand wafers are so coated, a peripheral groove of one inch or more in maximum depth can be formed. The affects of such erosion on the uniformity of the deposited coatings is demonstrated by FIGS. 2 and 4.

Figure 3:
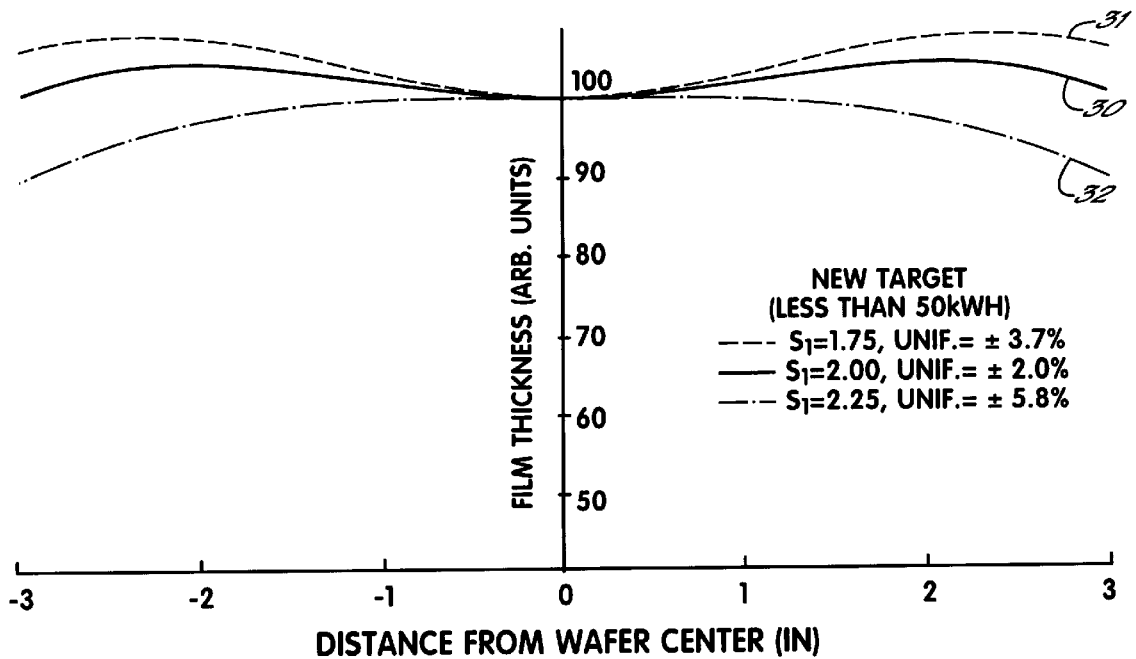
FIG. 3 is a graph illustrating the effects of changes in target-to-substrate distance on sputtered film uniformity.

With a new target 14 having its surface essentially conforming to that of surface 13 of FIG. 2, and with an optimized target-to-substrate spacing of, for example two inches, the sputtered film thickness deposited on the wafer 16 may be that represented by the curve 30 in FIG. 3, which is plotted in arbitrary units across the surface of a six inch wafer. The uniformity of the thickness represented by the curve 30 is, for example, +/−2% across the surface of the substrate 16.

Also illustrated in FIG. 3 is a curve 31 representing the thickness of the deposited film across the surface of the wafer with the spacing from the surface 13 to the wafer 16 reduced to 1.75 inches. In such a configuration, a uniformity of +/−3.7% is realized across the surface of the six inch wafer. Such degradation in uniformity is typical of changing the target-to-substrate spacing of a system that has been designed for 2.0 inches to 1.75 inches. Similarly, curve 32 represents an erosion profile having a uniformity of +/−5.8%, and is typical of that resulting from a change in the target-to-substrate spacing from a designed spacing of 2.0 inches to 2.25 inches. As can be seen, the effects of changes in the target-to-substrate spacing are more pronounced around the periphery of the substrate 16 but are not much less pronounced and almost insignificant near the center of the substrate 16. It is the change in distance and angle of incidence between the substrate 16 and the erosion groove 23 and 25, resulting from a deviation from the designed spacing, that causes this effect.

In to FIG. 4, the curve 30 is again illustrated. With a new target 14 that is within the first 50 kWH of usage, the uniformity of the film deposited onto wafers 16 therewith is, for example, 2.0%. Also illustrated are two curves 33 and 34 representing film thickness, in arbitrary units, across the surface of a six inch wafer, with the target-to-substrate spacing maintained at the initial spacing $S_1$ equal to 2.00 inches from the initial surface 13 of the target 14. Curve 33 represents the film thickness distribution across the substrate 16 after 750 kWH of usage of the target and corresponds to the uniformity distribution on wafers coated with the target 14 at the state of erosion illustrated by the erosion profile 22 of FIG. 2, at which point the uniformity has deteriorated to 3.1%. Curve 34 represents the film thickness distribution across the surface of the substrate after 1500 kWH of usage of the target 14 and corresponds to the uniformity distribution on wafers coated with the target 14 at the state of erosion illustrated by the erosion profile 24 of FIG. 2, at which point the uniformity across wafers has further deteriorated to 6.2% across the wafer.

Figure 5:
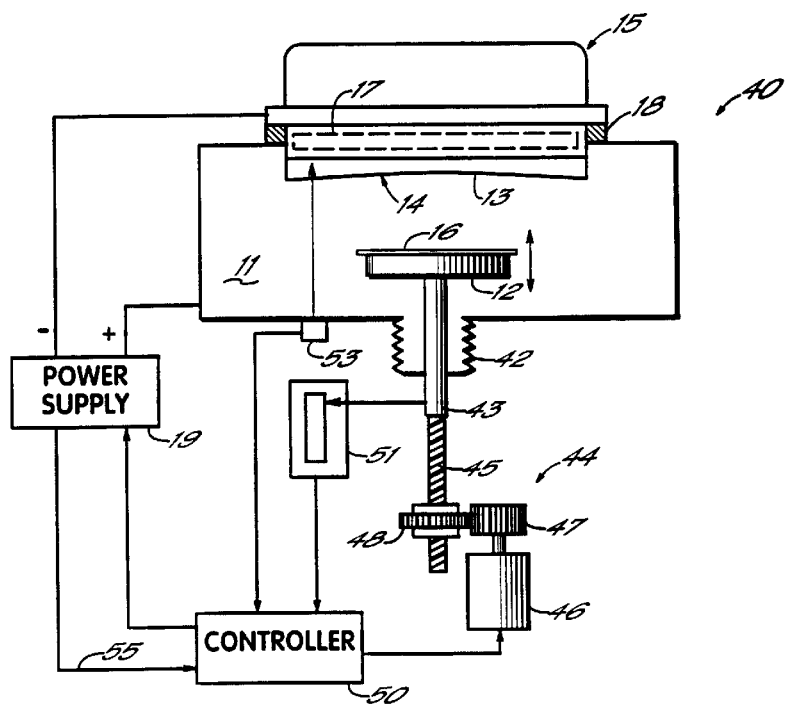
FIG. 5 is diagrammatic representation of a sputter coating apparatus according to principles of the present invention.

FIG. 5 illustrates diagrammatically one preferred embodiment of a sputtering apparatus 40 according to principles of the present invention, which is similar to the apparatus 10 of FIG. 1, but differs as set forth here. In the apparatus 40, the support platform 12 on which is mounted the wafer 16 is movably mounted in the sputtering chamber 11 through a flexible sealing bellows 42, which is sealed to a supporting stem 43 on the bottom of the platform 12. The stem 43 is mounted so as to be driven toward and away from the cathode assembly 15 on a platform drive assembly 44, which may be in the form of a ball screw drive or, as illustrated, include a screw drive 45 that is driven by a servo or stepper motor 46 through a set of gears 47 and 48. Any such drive mechanism that can move the substrate with respect to the target with precision, without interfering with the sputtering process, may be used.

The operation of the motor 46 is controlled by a computer or logic controller 50, which delivers a control signal to the motor 46 in response to which the motor 46 drives the platform 12 to a specified position relative to the cathode assembly 15. The position of the platform 12 is monitored by a sensor 51 that generates a feed back signal to the controller 50. The sensor 51 is, for example, a linear resolver, as illustrated, or may be provided by feedback elements that are provided with the motor 46. The controller 50 generates the control signal to the motor 46 in response to a determination of the eroded condition of the target 14. The determination may be made in response to direct measurement by a non-contact sensor of the target 14. Preferably, however, in the alternative or in addition, the controller may correlate a measurement of the total energy consumed in the sputtering process since the target 14 was first installed in the machine 40. Such information may be derived from a power measurement or cumulative energy measurement on output 55 from the power supply 19. Such energy meters are typically provided on power supplies such as supply 19 that are specifically designed for use in sputter coating equipment. Total sputtering energy consumed by a target has a direct relation to the sputtering profile of a target with a given cathode configuration and target type. Thus, empirical data stored in the computer 50 provides a basis for looking up or calculating the erosion profile or depth of the peripheral erosion groove at any point in the life of the target 14 based on the measured energy consumed by the target 14 over its life.

Figure 6:
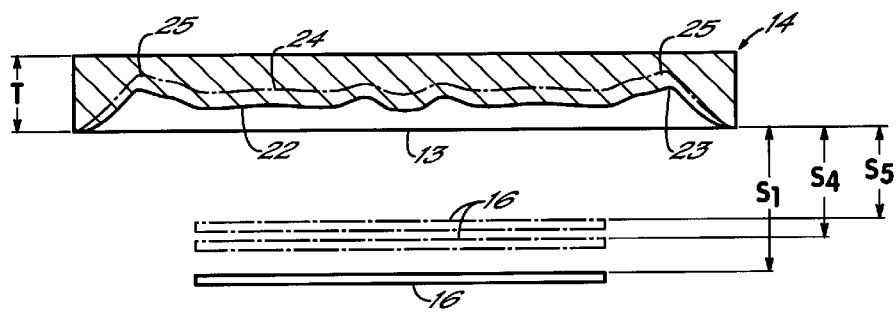
FIG. 6 is a cross-sectional diagram similar to FIG. 2 of the sputtering target of the apparatus of FIG. 5 showing the initial position and shape of its sputtering surface and two erosion profiles that are typical at points in the life of the target and associated target-to-substrate distances.

The operation of the controller 50, which preferably contains digital memory and a specially programmed microprocessor for such purpose, generates the control signal to the motor 46 so as to progressively adjust the spacing of the wafer 16 from the target 14 as illustrated in FIG. 6, over the life of the target.

Figure 4:
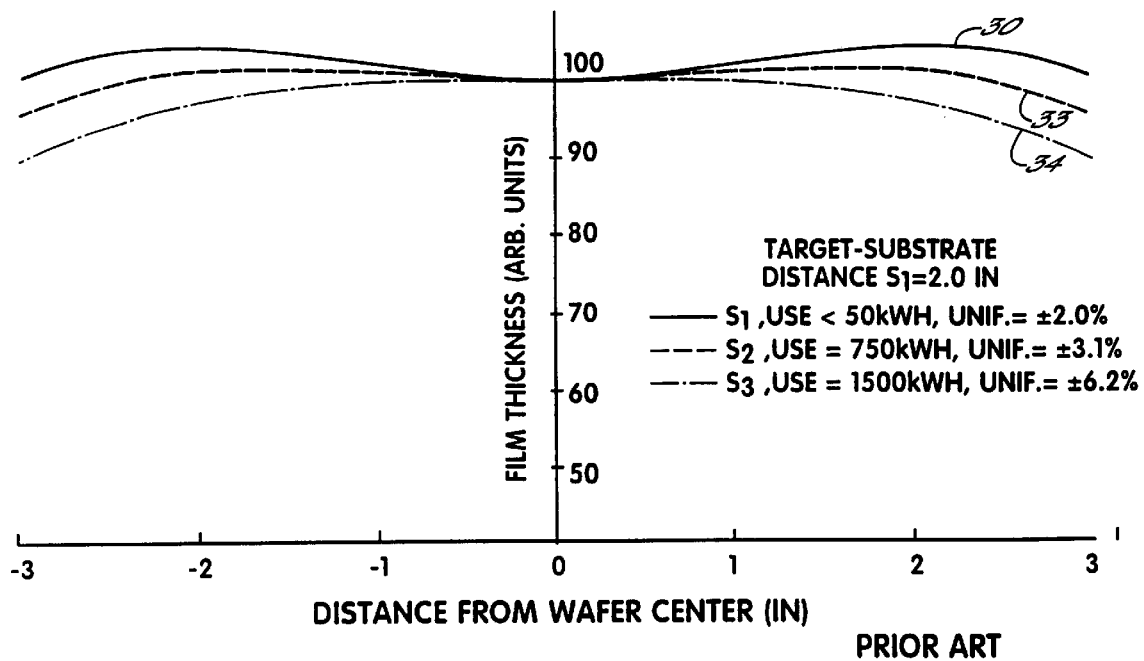
FIG. 4 is a graph similar to that of FIG. 3 but illustrating the changes in sputtered film uniformity with the prior art apparatus of FIG. 1 at the surface position and erosion profiles shown in FIG. 2.
Figure 7:
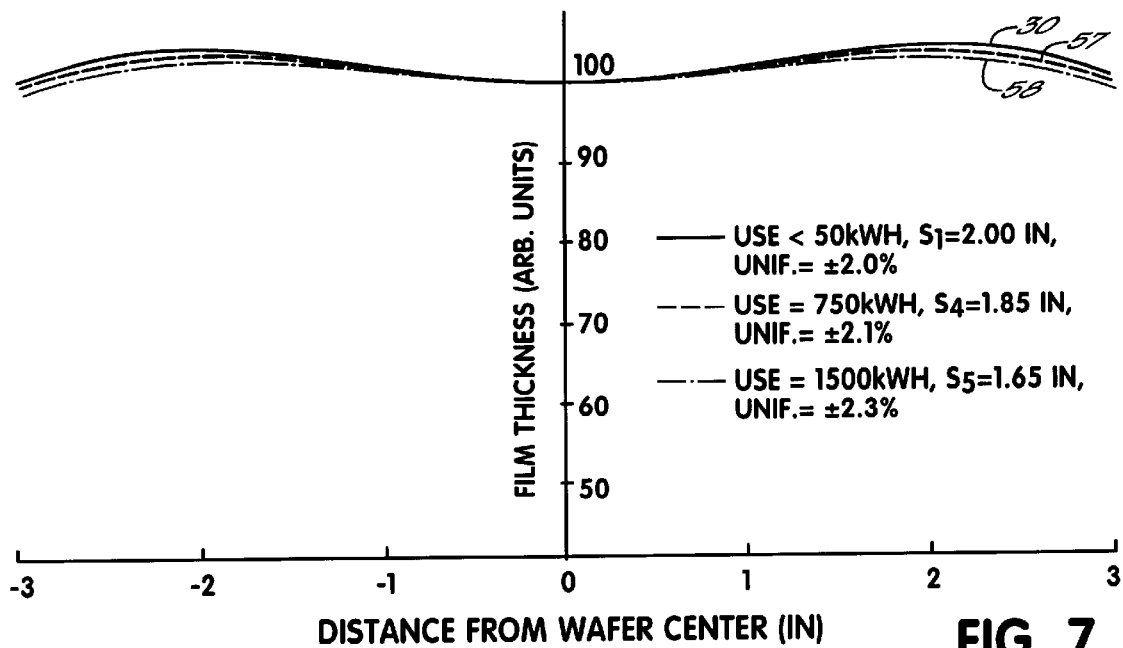
FIG. 7 is a graph similar to that of FIG. 4 illustrating the changes in sputtered film uniformity with the apparatus of FIG. 5 at the surface position and erosion profiles shown in FIG. 6.

The result of the invention in which the apparatus 40 of FIG. 5 is operated as illustrated in FIG. 6, is the series of deposition film thickness curves illustrated in FIG. 7, in which the curve 30 is the same as that of FIGS. 3 and 4, with target life being not more than 50 kWH with the spacing of the substrate 16 being 2.00 inches from the initial position of the surface 13 of the target 14, at which the uniformity is +/−2.0%. Curve 57 represents the film across a wafer 16 coated with the target having 750 kWH of usage, and with the spacing of the wafer 16 from the target being reduced such that the distance $S_4$ is 1.85 inches by moving the platform 12 closer to the cathode assembly 15 through operation of the motor 46. The substrate 16 is thereby moved 0.15 inches. The uniformity of the coating on such wafer is +/−2.1%.

As FIG. 7 further illustrates, curve 58 represents a uniformity of 2.3% across a wafer 16 coated with the target 14 at 1500 kWH of usage on the target. This is realized by moving the substrate 14 to a distance $S_5$ of 1.65 inches from the bottom of the groove 25 of erosion profile curve 24 of FIG. 6 This is achieved by the motor 46 moving the platform 12 during the first 1500 kWH of usage of the target 14 a total distance that is 0.35 inches closer to the target 14 than it was when the target 14 was new.

In operation, the position of the platform 12 is preferably periodically adjusted during the life of the target 14. With targets of thicknesses of, 1½ inches, a large number of, for example, several thousand wafers are coated with a single target 14 before the target 14 is completely expended. Such adjustment of the position of the platform 12 may then be made after, but preferably not during, the processing of each wafer, or after the processing of any predetermined number of wafers. Wafer count can be used to determine the amount of movement to be made to the platform 12, rather than using the outputs 53 or 55, which respectively represent a direct measurement of target surface position and target energy consumption. Whatever method of measurement is used, some conversion factor, table, algorithm or other information base is preferably stored in a digital memory so that a computer, controller or operator initiated action can convert the measurement into the correct adjustment to be made to the target-to-substrate spacing that will optimize coating uniformity on the substrate. Thus, using such wafer count alone, sufficient information, such as a table derived from imperically collected or computer modeled conversion data, would be stored in the processor of the controller 50 to make possible determination of how much positional change of wafer 16 corresponds to each wafer count. The conversion data so acquired would account for the effects of all of the factors pecular to the specific target, cathode assembly and sputtering apparatus, and process parameters employed.

From the above, it will be apparent to those of ordinary skill in the art that changes and additions can be made to the embodiments described and above and illustrated in the drawings without departing from the principles of the present invention.

Therefore, what is claimed is:

1. A method of maintaining, from substrate to substrate, the uniformity, across the surface of a substrate, of a film sputtered from a relatively thick sputtering target that substantially erodes over its life, the method comprising the step of:

sputtering, from a sputtering target of a given design, a film onto a plurality of substrates at each of a plurality of distances from the target and measuring the film thickness uniformity across the surfaces of the substrates;

based on film thickness uniformity measurements, empirically deriving target-to-substrate spacing as a function of target erosion that will cause a film of a given uniformity to be sputtered onto a substrate from a target of the given design;

sputtering, from a sputtering target of the given design, a film of the given thickness uniformity across the surface of a first substrate; then determining the state of erosion of the sputtering target; then changing target-to-substrate spacing in accordance with the empirically derived function; then sputtering a film of the given uniformity across the surface of a second substrate from the sputtering target.

2. The method of claim 1 wherein:

the step of determining the state of target erosion includes the step of generating a signal representative of the state of erosion of the sputtering target; then the step of changing target-to-substrate spacing in accordance with the function of target erosion is performed in response to the generated signal.

3. The method of claim 2 wherein:

repeating the generating and changing steps; and then sputtering a film of the given thickness uniformity across the surface of a third substrate from the sputtering target.

4. The method of claim 2 further comprising the step of:

sensing a target parameter related to the target erosion and generating the signal in response thereto;

calculating, in response to the signal, with a processor of a controller, an adjusted target-to-substrate spacing and that will maintain the given film thickness uniformity across the surface of the next substrate to be sputter coated; and the spacing changing step comprising changing the target-to-substrate spacing to the calculated adjusted target-to-substrate spacing.

5. The method of claim 4 wherein:

the sensing step comprises sensing the position of at least one point on the surface of the target after erosion thereof; and the spacing changing step comprises changing the spacing as a function of the sensed positions on the surface of the target after erosion.

6. The method of claim 4 wherein:

the sensing step comprises measuring energy consumed by the target from a beginning point in the life of the target; and the spacing changing step comprises changing the spacing as a function of the measured energy.

* * * * *